US012563869B2

(12) United States Patent
Cao et al.

(10) Patent No.: US 12,563,869 B2
(45) Date of Patent: Feb. 24, 2026

(54) LIGHT EMITTING DIODE DEVICE AND LIGHT EMITTING APPARATUS

(71) Applicant: Quanzhou Sanan Semiconductor Technology Co., Ltd., Nanan City (CN)

(72) Inventors: Linhua Cao, Xiamen (CN); Wanjun Chen, Xiamen (CN); Huining Wang, Xiamen (CN); Heying Tang, Xiamen (CN); Chunlan He, Xiamen (CN); Lili Jiang, Xiamen (CN); Liming Zhang, Xiamen (CN); Renlong Yang, Xiamen (CN); Chung-Ying Chang, Xiamen (CN)

(73) Assignee: QUANZHOU SANAN SEMICONDUCTOR TECHNOLOGY CO., LTD., Nanan City (CN)

( * ) Notice: Subject to any disclaimer, the term of this patent is extended or adjusted under 35 U.S.C. 154(b) by 620 days.

(21) Appl. No.: 17/969,077

(22) Filed: Oct. 19, 2022

(65) Prior Publication Data

US 2023/0163244 A1     May 25, 2023

(30) Foreign Application Priority Data

Nov. 23, 2021    (CN) .......................... 202111395331.6

(51) Int. Cl.
*H10H 20/831*    (2025.01)
*H10H 20/821*    (2025.01)
*H10H 20/841*    (2025.01)

(52) U.S. Cl.
CPC ........ *H10H 20/831* (2025.01); *H10H 20/821* (2025.01); *H10H 20/841* (2025.01)

(58) Field of Classification Search
None
See application file for complete search history.

(56) References Cited

U.S. PATENT DOCUMENTS

2008/0315240 A1* 12/2008 Kim ..................... H10H 20/819
257/E33.062
2017/0179343 A1* 6/2017 Chou ................. H10H 20/8162
2019/0148595 A1* 5/2019 Chou ................. H10H 20/8162
257/99

* cited by examiner

*Primary Examiner* — Bilkis Jahan
(74) *Attorney, Agent, or Firm* — Muncy, Geissler, Olds & Lowe, P.C.

(57) ABSTRACT

A light emitting diode device includes an epitaxial layered structure and first and second electrodes that are disposed on the epitaxial layered structure. The second electrode includes a body portion and at least one extending portion connected to the body portion and extending in a direction away from the body portion. The extending portion includes at least one curved section. A projection of the curved section on the epitaxial layered structure includes first and second curved sides that are opposite to each other and that are curved in an identical direction. The first curved side has a first imaginary center of curvature, and the second curved side has a second imaginary center of curvature. A distance between the first imaginary center of curvature and the second imaginary center of curvature is equal to or smaller than 5 μm.

20 Claims, 12 Drawing Sheets

LIGHT EMITTING DIODE DEVICE AND LIGHT EMITTING APPARATUS

CROSS-REFERENCE TO RELATED APPLICATION

This application claims priority to Chinese Invention Patent Application No. 202111395331.6, filed on Nov. 23, 2021. The entire content of the Chinese patent application is incorporated herein by reference.

FIELD

The disclosure relates to a semiconductor device, and more particularly to a light emitting diode device and a light emitting apparatus including the same.

BACKGROUND

Light emitting diodes (LEDs) are usually made of semi-conductor materials such as gallium nitride (GaN), gallium arsenide (GaAs), gallium phosphide (GaP), gallium arsenide phosphide (GaAsP), etc. An LED includes a P-N junction having a light emitting property. By applying a forward bias to the LED, electrons flow from an N region to a P region of the LED while holes flow from the P region to the N region, then charge carriers recombine at the P-N junction to emit light. The LEDs are considered to be one of the light sources having the most potential as they offer advantages such as high luminous intensity, high efficiency, small size and long lifespan. The LEDs are widely applied in various fields in daily life, for example, lighting, signal display, backlight source, vehicle lamp and big screen display. A trend to develop an LED device with increased brightness and light emitting efficiency has emerged in recent years to meet the market's various demands of applications.

In the current LED device, a high concentration of charge carriers may easily be accumulated at connected regions between metal pad(s) and extending electrode(s) (e.g., finger electrode), causing current crowding. In particular, as the LED device ages, these connected regions (i.e., where current crowding occurs) may face a high risk of burnout, so performance of the LED device may be reduced and the LED device may even be destroyed.

Therefore, optimizing the configuration of the LED device having the extended electrode(s) so as to reduce current crowding becomes an issue awaiting to be resolved.

SUMMARY

Therefore, an object of the disclosure is to provide a light emitting diode (LED) device and a light emitting apparatus that can alleviate at least one of the drawbacks of the prior art.

According to a first aspect of the disclosure, the LED device includes an epitaxial layered structure, a first elec-trode and a second electrode. The epitaxial layered structure includes a first semiconductor layer, a light emitting layer and a second semiconductor layer sequentially disposed in such an order. The first electrode is disposed on the epitaxial layered structure and is electrically connected to the first semiconductor layer. The second electrode is disposed on the epitaxial layered structure, is electrically connected to the second semiconductor layer, and includes a body portion and at least one extending portion that is connected to the body portion and that extends in a direction away from the body portion. The extending portion includes at least one curved section. A projection of the curved section on the epitaxial layered structure includes a first curved side and a second curved side that are opposite to each other and that are curved in an identical direction. The first curved side has a first imaginary center of curvature and a first radius of curvature. The second curved side has a second imaginary center of curvature, and a second radius of curvature that is larger than the first radius of curvature. A distance between the first imaginary center of curvature and the second imaginary center of curvature is equal to or smaller than 5 µm.

According to a second aspect of the disclosure, the light emitting apparatus includes the aforementioned LED device.

BRIEF DESCRIPTION OF THE DRAWINGS

Other features and advantages of the disclosure will become apparent in the following detailed description of the embodiments with reference to the accompanying drawings. It is noted that various features may not be drawn to scale.

DETAILED DESCRIPTION

Figure 1:
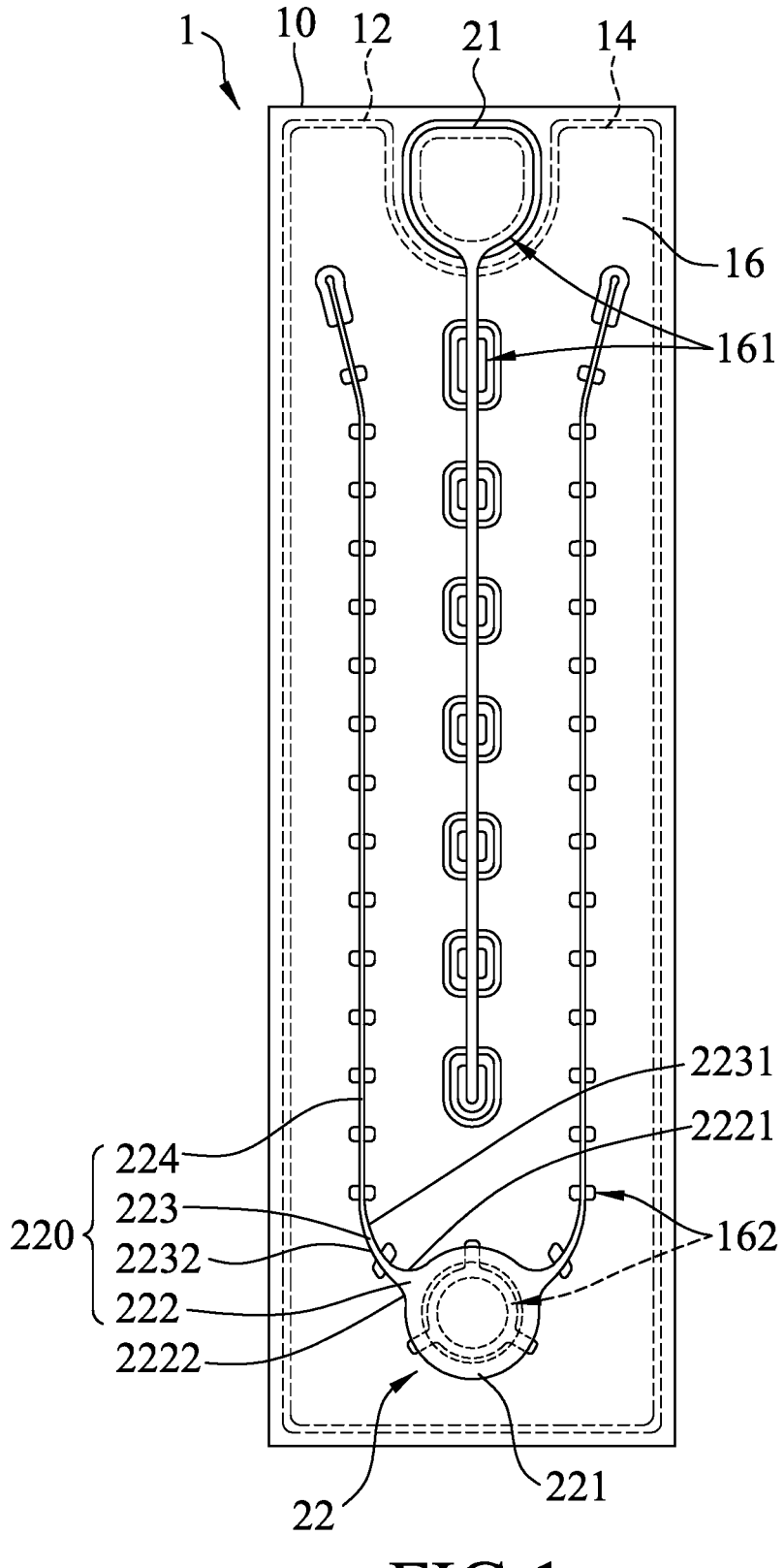
FIG. 1 is a schematic top view illustrating a first embodi-ment of a light emitting diode (LED) device according to the disclosure.
Figure 2:
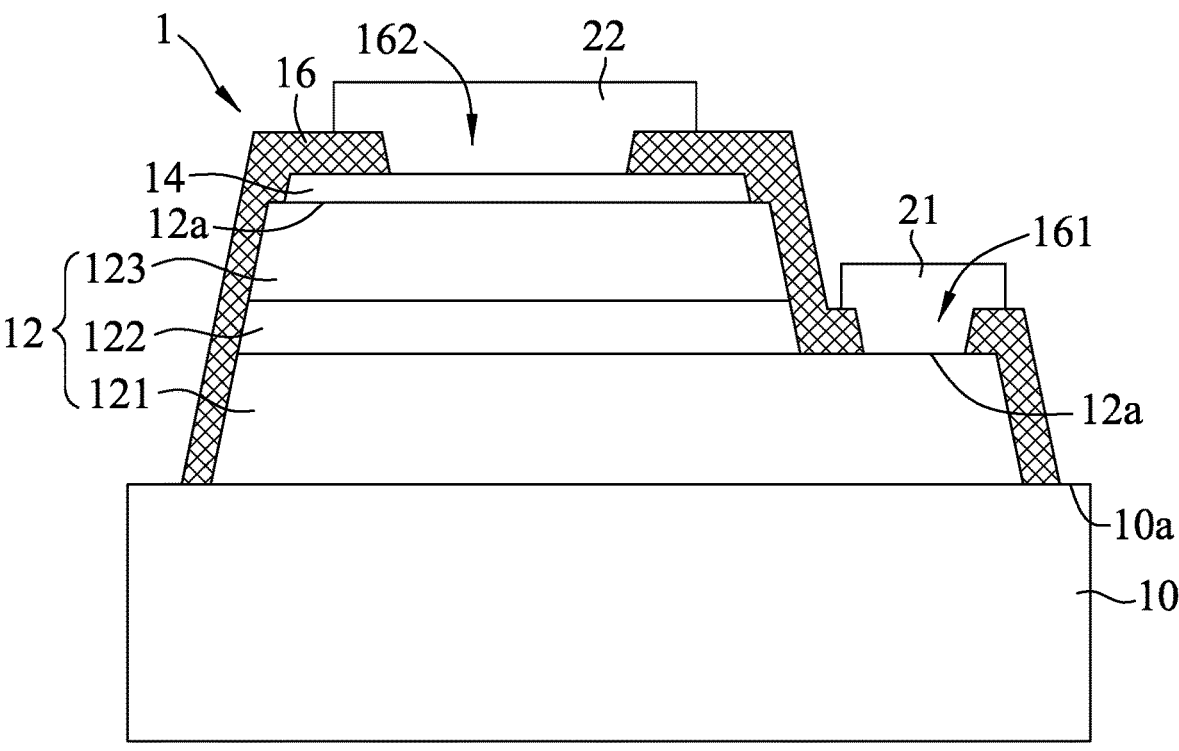
FIG. 2 is a schematic sectional view illustrating the first embodiment of the LED device.

Before the disclosure is described in greater detail, it should be noted that where considered appropriate, refer-ence numerals or terminal portions of reference numerals have been repeated among the figures to indicate corre-sponding or analogous elements, which may optionally have similar characteristics.

Referring to FIGS. 1 to 4, a first embodiment of a light emitting diode (LED) device 1 according to the disclosure includes a substrate 10 having a substrate surface 10a, an epitaxial layered structure 12 having an epitaxial surface 12a opposite to the substrate surface 10a, a first electrode 21 and a second electrode 22.

The substrate 10 may be a light-transmissible substrate, an opaque substrate or a semi-transparent substrate. In a case of the substrate 10 being a light-transmissible or semi-transparent substrate, light emitted from the epitaxial lay-ered structure 12 may pass through the substrate 10 and reach a side of the substrate 10 opposite to the epitaxial layered structure 12. The substrate 10 may be, but is not limited to, a flat sapphire substrate, a patterned sapphire substrate, a silicon substrate, a silicon carbide substrate, a gallium nitride substrate or a glass substrate.

In certain embodiments, the substrate 10 is a patterned substrate that a protruding configuration (not shown), which may be a monolayer structure or a multi-layered structure containing at least one light extraction layer, is disposed on. The light extraction layer may have a refractive index lower than that of the substrate 10, and a thickness that is greater than half of a height of the protruding configuration, which may enhance the light exiting efficiency of the LED device 1. In certain embodiments, the protruding configuration may be formed as a dome-shaped structure, and the refractive index of the light extraction layer may be smaller than 1.6. For example, the light extraction layer may be made of silicon dioxide ($SiO_2$). In certain embodiments, the substrate 10 may be thinned or removed so as to form a thin film-type LED chip.

The epitaxial layered structure 12 is disposed on the substrate surface 10a of the substrate 10 and includes a first semiconductor layer 121, a light emitting layer 122 and a second semiconductor layer 123 that are sequentially disposed on the substrate surface 10a in such order.

The first semiconductor layer 121 is formed on the substrate surface 10a of the substrate 10 and may be doped with n-type dopants. For example, the first semiconductor layer 121 may be, but is not limited to, a gallium nitride (GaN)-based semiconductor layer doped with silicon (Si). In certain embodiments, the epitaxial layered structure 12 further includes a buffer layer (not shown) that is disposed between the first semiconductor layer 121 and the substrate 10. In certain embodiments, the first semiconductor layer 121 may be connected to the substrate 10 through a bonding layer (not shown).

The light emitting layer 122 is disposed on the first semiconductor layer 121 opposite to the substrate 10 and may have a quantum well (QW) structure. In certain embodiments, the light emitting layer 122 may have a multiple quantum well (MQW) structure that includes multiple well layers and multiple barrier layers alternately and repetitively stacked. Additionally, the wavelength of the light emitted by the light emitting layer 122 may be determined by the composition and the thickness of the well layers. That is to say, by adjusting the composition of the well layers and the barrier layers, the light emitting layer 122 may emit different colors of light, such as ultraviolet light, blue light or green light.

The second semiconductor layer 123 is disposed on the light emitting layer 122 opposite to the first semiconductor layer 121 and may be a semiconductor layer doped with p-type dopants. For example, the second semiconductor layer 123 may be, but is not limited to, a GaN-based semiconductor layer doped with magnesium (Mg). Each of the first semiconductor layer 121 and the second semiconductor layer 123 may have a monolayer structure or a multi-layered structure that includes a superlattice layer. In certain embodiments, the first semiconductor layer 121 may be doped with p-type dopants and the second semiconductor layer 123 may be doped with n-type dopants, i.e., the first semiconductor layer 121 is a p-type semiconductor layer and the second semiconductor layer 123 is an n-type semiconductor layer.

The LED device 1 according to the disclosure may further include an electrically conductive layer 14 and an insulating layer 16. The electrically conductive layer 14 is light-transmissible and is disposed on the second semiconductor layer 123 to spread current. In certain embodiments, a projection of the electrically conductive layer 14 on the substrate 10 substantially falls within a projection of the second semiconductor layer 123 on the substrate 10 so as to achieve a more uniform current distribution and enhance the performance of light exiting. The electrically conductive layer 14 may include a transparent and electrically conductive material (e.g., a transparent and electrically conductive oxide) so as to increase the reliability of the LED device 1. The transparent and electrically conductive material may be, but is not limited to, indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO) and combinations thereof.

The insulating layer 16 covers the epitaxial layered structure 12 and the transparent and electrically conductive layer 14. In other words, the insulating layer 16 may be disposed on the epitaxial surface 12a (i.e., in contact with the first semiconductor layer 121 and the second semiconductor layer 123) and side surfaces of the epitaxial layered structure 12 that connect the epitaxial surface 12a and the substrate surface 10a, and may extend to be disposed on a portion of the substrate surface 100a that is exposed from the epitaxial layered structure 12. The insulating layer 16 is formed with a first opening 161 exposing the first semiconductor layer 121 and a second opening 162 exposing the second semiconductor layer 123.

The insulating layer 16 may perform different functions depending on its location in the LED device 1. For example, the insulating layer 16 covering the side surfaces of the epitaxial layered structure 12 may prevent electrically conductive material(s) from electrically connecting to the first semiconductor layer 121 and the second semiconductor layer 123, thereby avoiding a short circuit of the LED device 1. The insulating layer 16 may include a non-conductive material such as an inorganic material (e.g., silicone) or a dielectric material. Examples of the dielectric material may include, but are not limited to, aluminum oxide (AlO), silicon nitride (SiNx), silicon oxide (SiOx), titanium oxide (TiOx), magnesium fluoride (MgFx), tantalum oxide, niobium oxide, barium titanate and combinations thereof. In certain embodiments, the insulating layer 16 may include a diffracted Bragg reflector (DBR) that is formed out of a periodic structure of layers of two of the aforementioned materials, which are repetitively stacked.

The first electrode 21 is disposed on the epitaxial layered structure 12 and is electrically connected to the first semiconductor layer 121. The second electrode 22 is disposed on the epitaxial layered structure 12 and is electrically connected to the second semiconductor layer 123. In this embodiment, the first electrode 21 fills the first opening 161 of the insulating layer 16 and is electrically connected to the first semiconductor layer 121, and the second electrode 22 fills the second opening 162 of the insulating layer 16 and is electrically connected to the second semiconductor layer 123.

The second electrode 22 includes a body portion 221, and at least one extending portion 220 connected to the body portion 221 and extending in a direction away from the body portion 221. In this embodiment, the second electrode 22 includes two extending portions 220 connected to opposite sides of the body portion 221. Each of the extending portions 220 may include a curved section 223, a connecting section 222 that connects the body portion 221 and the curved section 223, and a straight section 224 that connects to the curved section 223 opposite to the connecting section 222.

Figure 3:
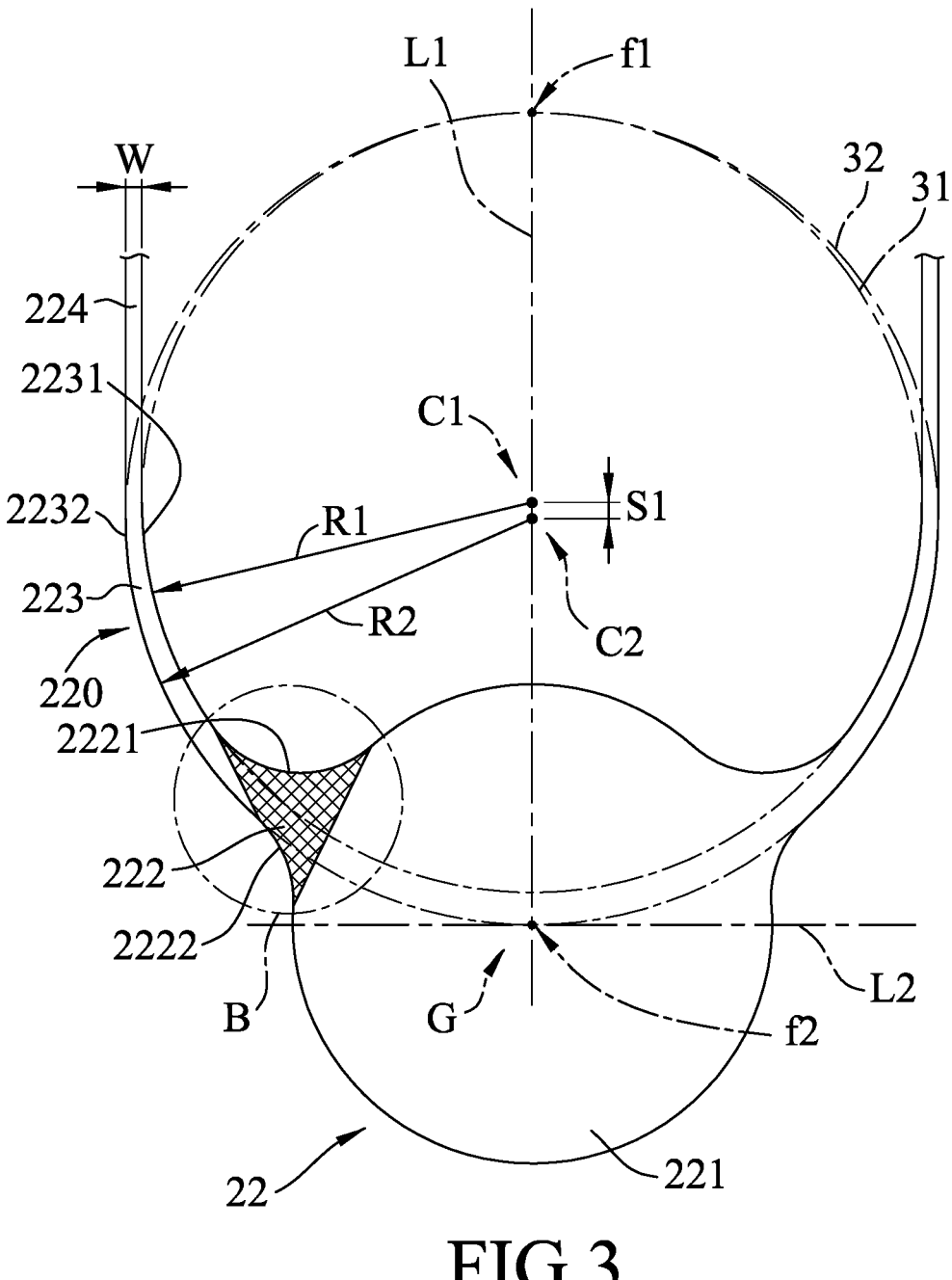
FIG. 3 is an enlarged view illustrating a second electrode of the first embodiment of the LED device.

As shown in FIGS. 1 and 3, a projection of the curved section 223 on the epitaxial layered structure 12 includes a first curved side 2231, and a second curved side 2232 that are opposite to each other. The first curved side 2231 has a first imaginary center of curvature (C1) and a first radius of curvature (R1). The second curved side 2232 has a second imaginary center of curvature (C2), and a second radius of curvature (R2) that is larger than the first radius of curvature (R1). The first curved side 2231 and the second curved side 2232 are curved in an identical direction. In this embodiment, the first curved side 2231 and the second curved side 2232 are curved outwardly in a direction away from the first electrode 21. A distance (S1) between the first imaginary center of curvature (C1) and the second imaginary center of curvature (C2) is equal to or smaller than 5 µm. By optimizing the design of the first curved side 2231 and the second curved side 2232 (e.g., increasing the distance (S1) between the first and second imaginary center of curvatures (C1, C2)), current crowding present in the curved section 223 may effectively be reduced and an area of injection of charge carriers may be expanded so that burnout of the curved section 223 may be prevented as the LED device 1 ages.

The imaginary center of curvature (C1) of the first curved side 22 and the imaginary center of curvature (C2) of the second curved side 22 are respectively referred to as centers of a first imaginary circle 31 completing the first curved side 2231 and a second imaginary circle 32 completing the second curved side 22. To be specific, the first curved side 2231 is a part of the first imaginary circle 31 (illustrated with a dot-dashed circle) and the second curved side 2232 is a part of the second imaginary circle 32 (illustrated with a dot-dashed circle). The first imaginary center of curvature (C1) and the second imaginary center of curvature (C2) coincide with centers of the first imaginary circle 31 and the second imaginary circle 32, respectively. The first radius of curvature (R1) of the first curved side 2231 and the second radius of curvature (R2) of the second curved side 2232 are radii of the first imaginary circle 31 and the second imaginary circle 32, respectively.

In this embodiment, as shown in FIG. 3, the first imaginary circle 31 is internally tangent to the second imaginary circle 32. In certain embodiments, the distance (S1) between the first imaginary center of curvature (C1) and the second imaginary center of curvature (C2) is equal to or greater than 1 µm. A width of the projection of the curved section 223 on the epitaxial layered structure 12 may gradually decrease in an extending direction from the connecting section 222 toward the straight section 224 so that current crowding in the curved section 223 may effectively be reduced.

In certain embodiments, the first curved side 2231 has an arc length equal to or smaller than one fourth of a circumference of the first imaginary circle 31, and the second curved side 2232 has an arc length equal to or smaller than one fourth of a circumference of the second imaginary circle 32. In this embodiment, the LED device 1 has a width that is smaller than 9 mil. In such case, the arc length of the first curved side 2231 may be equal to or smaller than one sixth of the circumference of the first imaginary circle 31, and the arc length of the second curved side 2232 is equal to or smaller than one fifth of the circumference of the second imaginary circle 32. In certain embodiments, a proportion of the arc length of the first curved side 2231 to the circumference of the first imaginary circle 31 is smaller than a proportion of the arc length of the second curved side 2232 to the circumference of the second imaginary circle 32. For example, the arc length of the first curved side 2231 may account for 10% of the circumference of the first imaginary circle 31, and the arc length of the second curved side 2232 may account for more than 10% of the circumference of the second imaginary circle 32.

In addition, a point of tangency between the first imaginary circle 31 and the second imaginary circle 32 is defined as a first point (f1), while a point on the second imaginary circle 32 that is the farthest from the first point (f1) is defined as a second point (f2). A first straight line (L1) connects the first point (f1) and the second point (f2). A second straight line (L2) that is perpendicular to the first straight line (L1) and passing through the second point (f2) passes through a geometric center (G) of a projection of the body portion 221 on the epitaxial layered structure 12. In certain embodiments, the second point (f2) coincides with the geometric center (G) of the projection of the body portion 221 on the epitaxial layered structure 12. With such arrangement, each of the extending portions 220 is configured to extend from the body portion 221 away from the second straight line (L2) and to be formed with the first curved side 2231 and the second curved side 2232, which is conducive to improve current spreading in the LED device 1 and thereby reduce current crowding.

In certain embodiments, when the body portion 221 is located in a position offset from its intended position, the second straight line (L2) may not pass through the geometric center (G) of the projection of the body portion 221 on the epitaxial layered structure 12 (i.e., there is a distance between the second straight line (L2) and the geometric center (G) of the projection of the body portion 221 on the epitaxial layered structure 12), which causes the width of the projection of the curved section 223 on the epitaxial layered structure 12 to gradually vary in the extending direction from the connecting section 223 toward the straight section 224.

In certain embodiments, the centers of the first imaginary circle 31 and the second imaginary circle 32 and the geometric center (G) of the projection of the body portion 221 are collinear. The extending portions 220 extend from the body portion 221 in a mirror symmetric manner relative to a straight line connecting the center of the first imaginary circle 31 and the geometric center (G) of the projection of the body portion 221. By forming two extending portions 220 on opposite sides of the body portion 221, current spreading in the LED device 1 of this disclosure may be improved and current crowding reduced.

The straight section 224 connects to the curved section 223 opposite to the connecting section 222. That is to say, the connecting section 222, the curve section 223 and the straight section 224 are connected in such order in a direction from the body portion 221 toward the first electrode 21. In certain embodiments, a projection of the connection section 222 on the epitaxial layered structure 12 has a width (W) that is equal to or greater than the width of the projection of the curved section 223 on the epitaxial layered structure 12. The width (W) of the projection of the straight section 224 on the epitaxial layered structure 12 ranges from 2 µm to 4 µm. In certain embodiments, a difference between the first radius of curvature (R1) and the second radius of curvature (R2) is equal to the width (W) of the projection of the straight section 224, i.e., R2–R1=W. In certain embodiments, the width (W) of the projection of the straight section 224 is equal to or smaller than the width of the projection of the curved section 223 on the epitaxial layered structure 12. When the width of the projection of the curved section 223 on the epitaxial layered structure 12 gradually decreases in the extending direction from the connecting section 222 toward the straight section 224, a projection of a connecting region between the straight section 224 and the curved section 223 has a width that is equal to a minimum width of the projection of the curved section 223 (i.e., a distance from a first connecting point that interconnects the first curved side 2231 and a projection of the straight section 224 on epitaxial layered structure 12 to a second connecting point that interconnects the second curved side 2232 and the projection of the straight section 224). In certain embodiments, the width of the projection of the curved section 223 is equal to or greater than the width (W) of the projection of the straight section 224 and is equal to or smaller than two times the width (W) of the projection of the straight section 224.

As used herein, the width of the projection of the curved section 223 refers to a distance between a given point on the first curved sides 2231 and a corresponding given point on second curved side 2232, which are respectively located on a first tangent line and on a line perpendicular to the first tangent line and to the first curved side 2231 at the given point.

Figure 4:
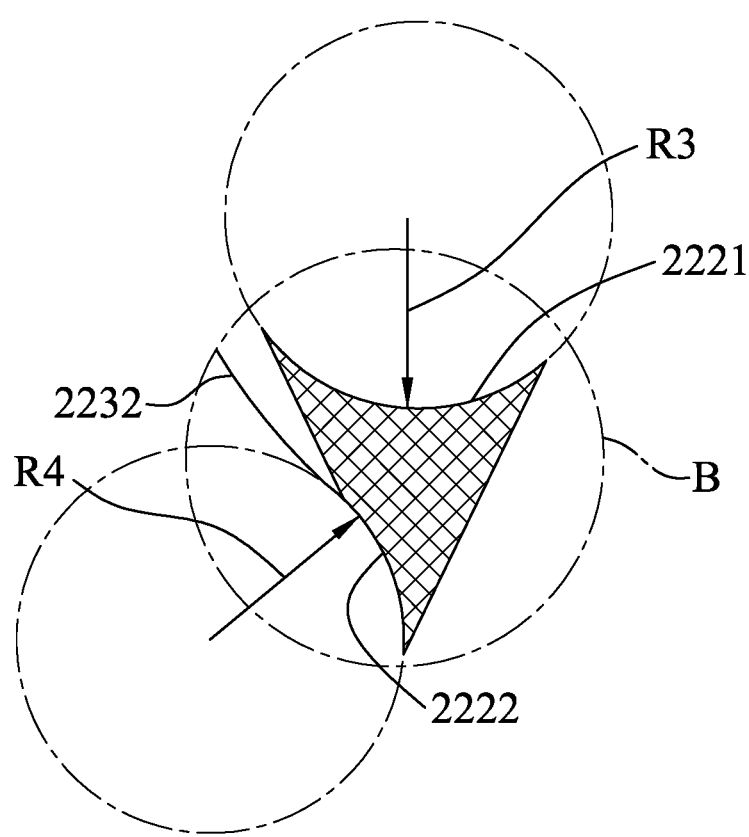
FIG. 4 is an enlarged view of a circular region B of FIG. 3.

Referring to FIGS. 3 and 4, the projection of the connecting section 222 on the epitaxial layered structure 12 includes a first connecting side 2221 and a second connecting side 2222 opposite to each other. The first connecting side 2221 is connected to the first curved side 2231 and has a third radius of curvature (R3). The second connecting side 2222 is connected to the second curved side 2232 and has a fourth radius of curvature (R4). The first connecting side 2221 and the second connecting side 2222 are curved in opposite directions. In other words, the first connecting side 2221 may be curved outwardly in the direction away from the first electrode 21, and the second connecting side 2222 may be curved inwardly in a direction toward the first electrode 21. The third radius of curvature (R3) and the fourth radius of curvature (R4) are smaller than the first radius of curvature (R1). In certain embodiments, each of the third radius of curvature (R3) and the fourth radius of curvature (R4) is equal to or greater than 10 μm. In certain embodiments, the third radius of curvature (R3) is equal to the fourth radius of curvature (R4). For example, each of the third radius of curvature (R3) and the fourth radius of curvature (R4) may be 10 μm or 15 μm.

Referring to FIGS. 5 to 8, consecutive steps for manufacturing the first embodiment of the LED device 1 are illustrated and described as follows. It should be noted that the shadow region depicted in each of FIGS. 5 to 8 represents an additional feature formed by a corresponding step in a given figure as compared to the previous figure.

Figure 5:
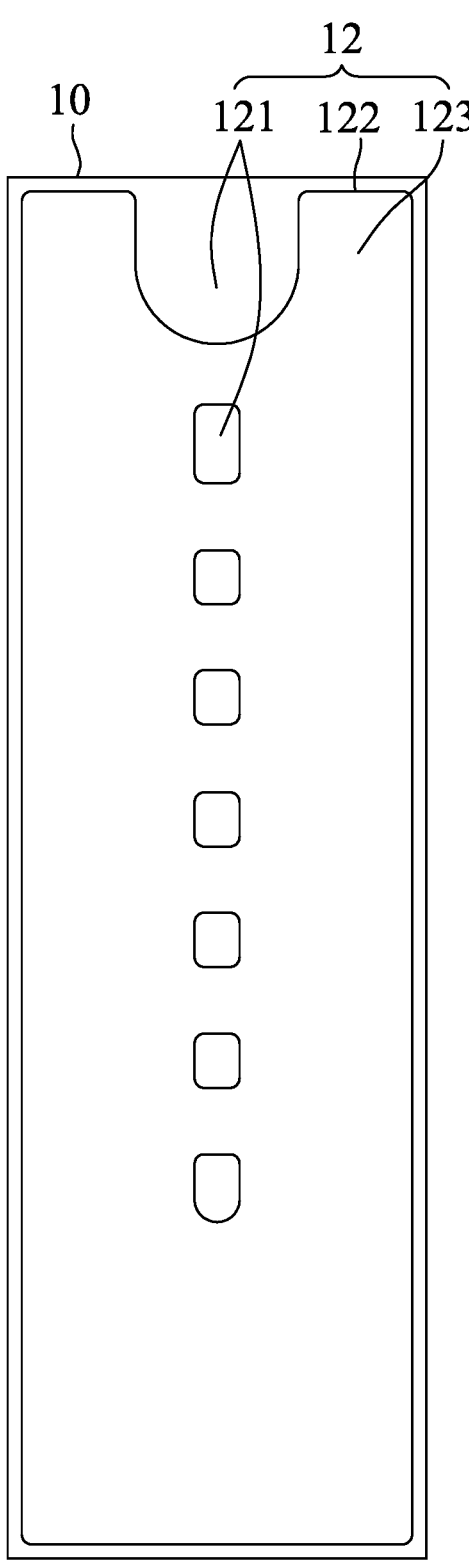
FIGS. 5 to 8 are schematic top views illustrating con-secutive steps for manufacturing the first embodiment of the LED device.

First, referring to FIG. 5, the epitaxial layered structure 12 that includes the first semiconductor layer 121, the light emitting layer 122 and the second semiconductor layer 123 is formed on the substrate 10. Then, the epitaxial layered structure 12 is etched in a direction from the second semiconductor layer 123 toward the substrate surface 10a until an opening that exposes a portion of the first semiconductor layer 121 is formed. In addition, a peripheral portion of the epitaxial layered structure 12 may selectively be etched to expose the substrate surface 10a, which may facilitate a fabrication process (e.g., cutting) that follows.

Figure 6:
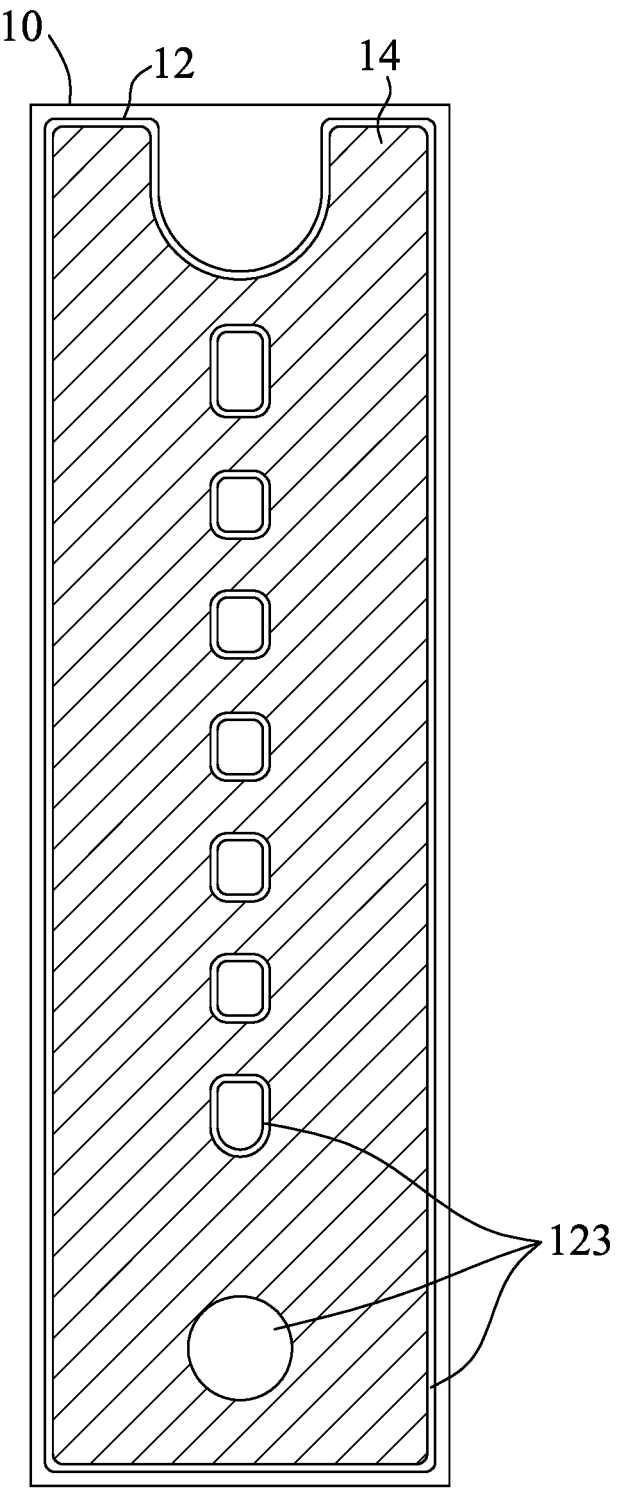

Next, referring to FIG. 6, the electrically conductive layer 14 is selectively formed on the second semiconductor layer 123 for spreading current and increasing the reliability of the LED device 1. The electrically conductive layer 14 is not in contact with the first semiconductor layer 121.

Figure 7:
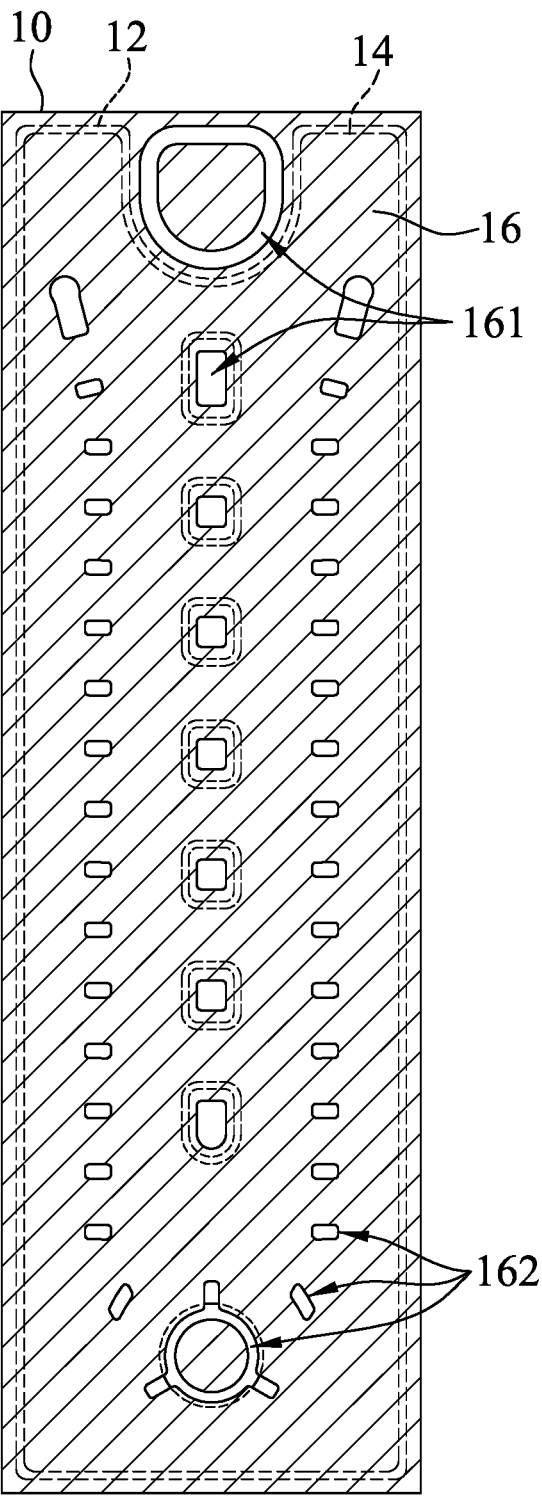

Next, referring to FIG. 7, the insulating layer 16 is formed on and covers the epitaxial layered structure 12, and further covers the electrically conductive layer 14. The insulating layer 16 is formed with the first opening 161 and the second opening 162 that expose the first semiconductor layer 121 and the second semiconductor layer 123, respectively. The insulating layer 16 is configured to isolate electrical conduction and protect components that are covered thereby.

Figure 8:
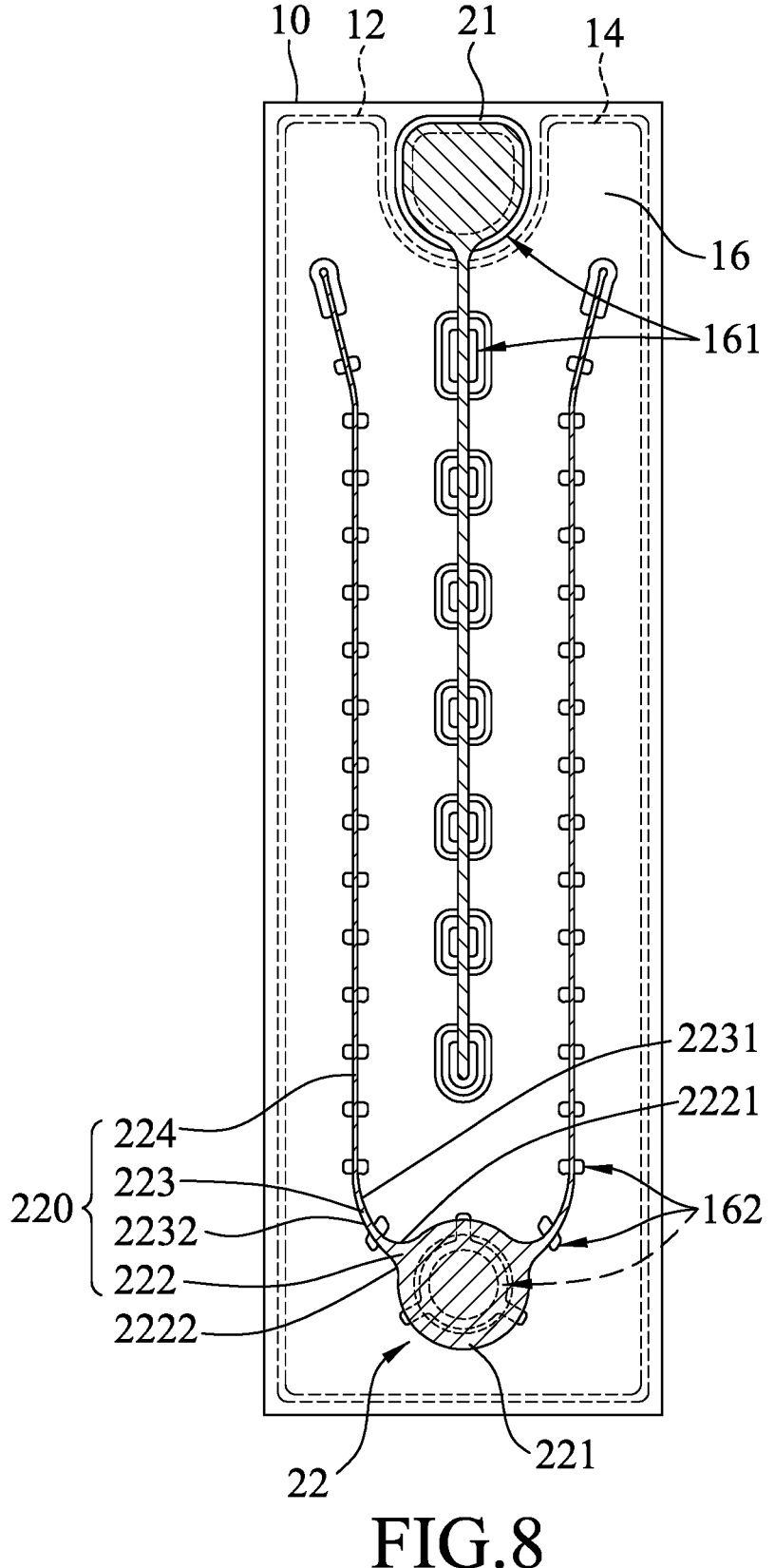

Afterwards, referring to FIG. 8, the first electrode 21 and the second electrode 22 formed on the insulating layer 16 are illustrated with different patterns. To be specific, the first electrode 21 is formed to be electrically connected to the first semiconductor layer 121 through the first opening 161, and the second electrode 22 is formed to be electrically connected to the second semiconductor layer 123 through the second opening 162. In certain embodiments, the body portion 221 of the second electrode 22 covers and fills the second opening 162 so that adhesion between the second electrode 22 and the electrically conductive layer 14 is enhanced and the second electrode 22 becomes difficult to be peeled off from the electrically conductive layer 14.

Figure 9:
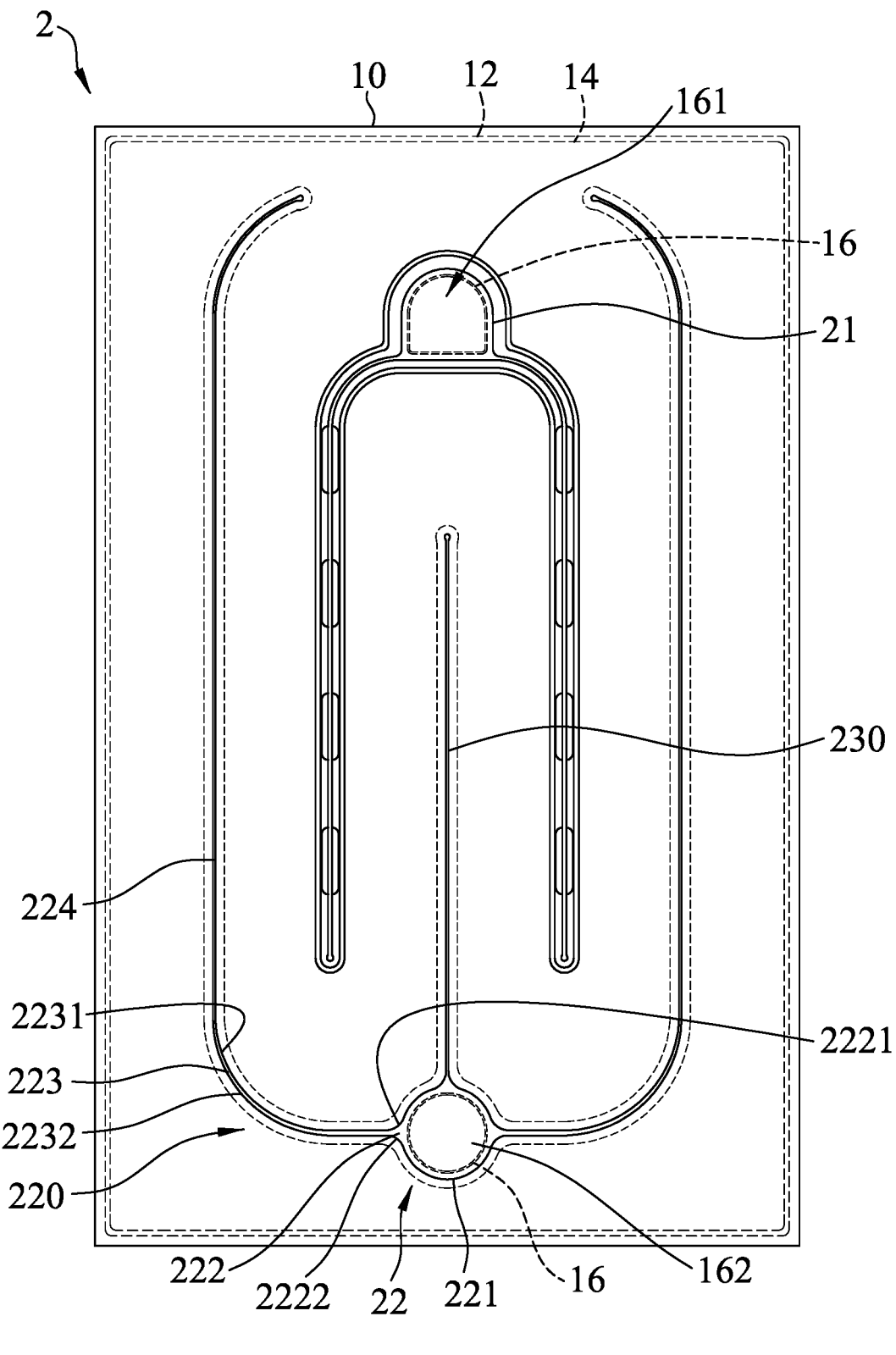
FIG. 9 is a schematic top view illustrating a second embodiment of the LED device according to the disclosure.
Figure 10:
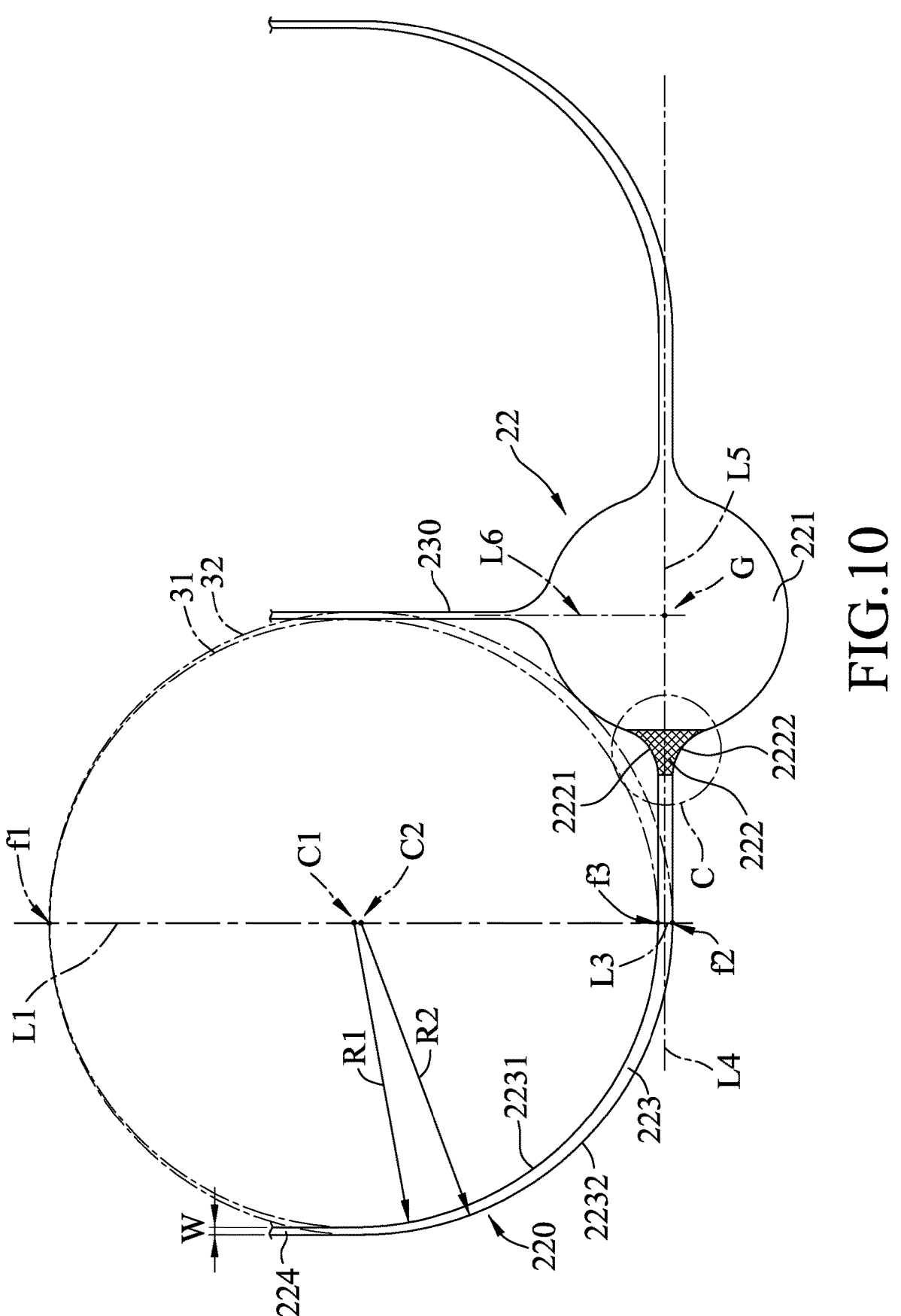
FIG. 10 is an enlarged view illustrating a second electrode of the second embodiment of the LED device.
Figure 11:
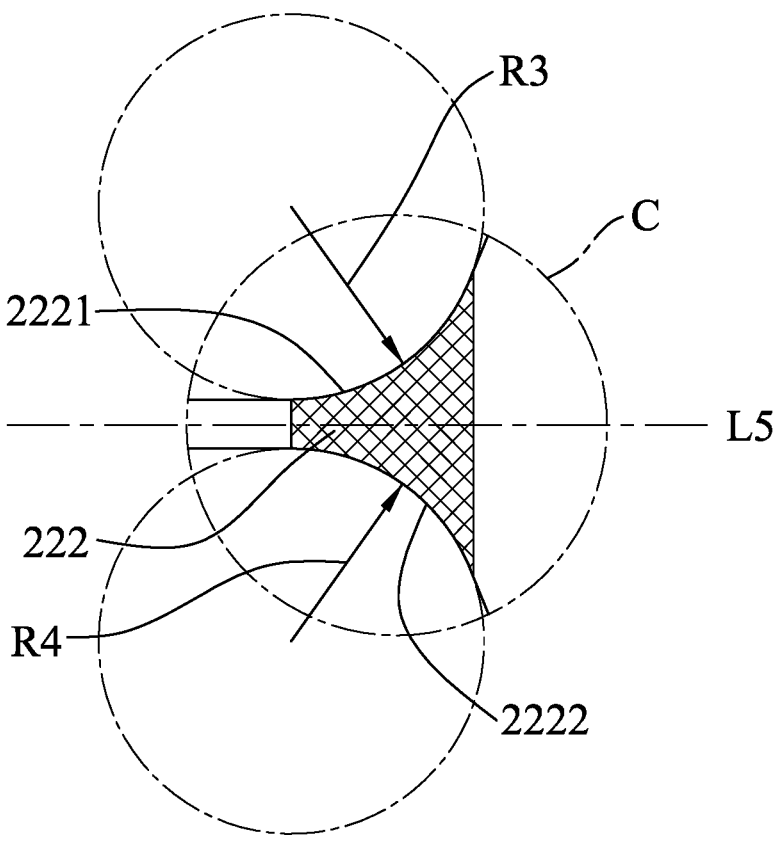
FIG. 11 is an enlarged view of a circular region C of FIG. 10.
Figure 12:
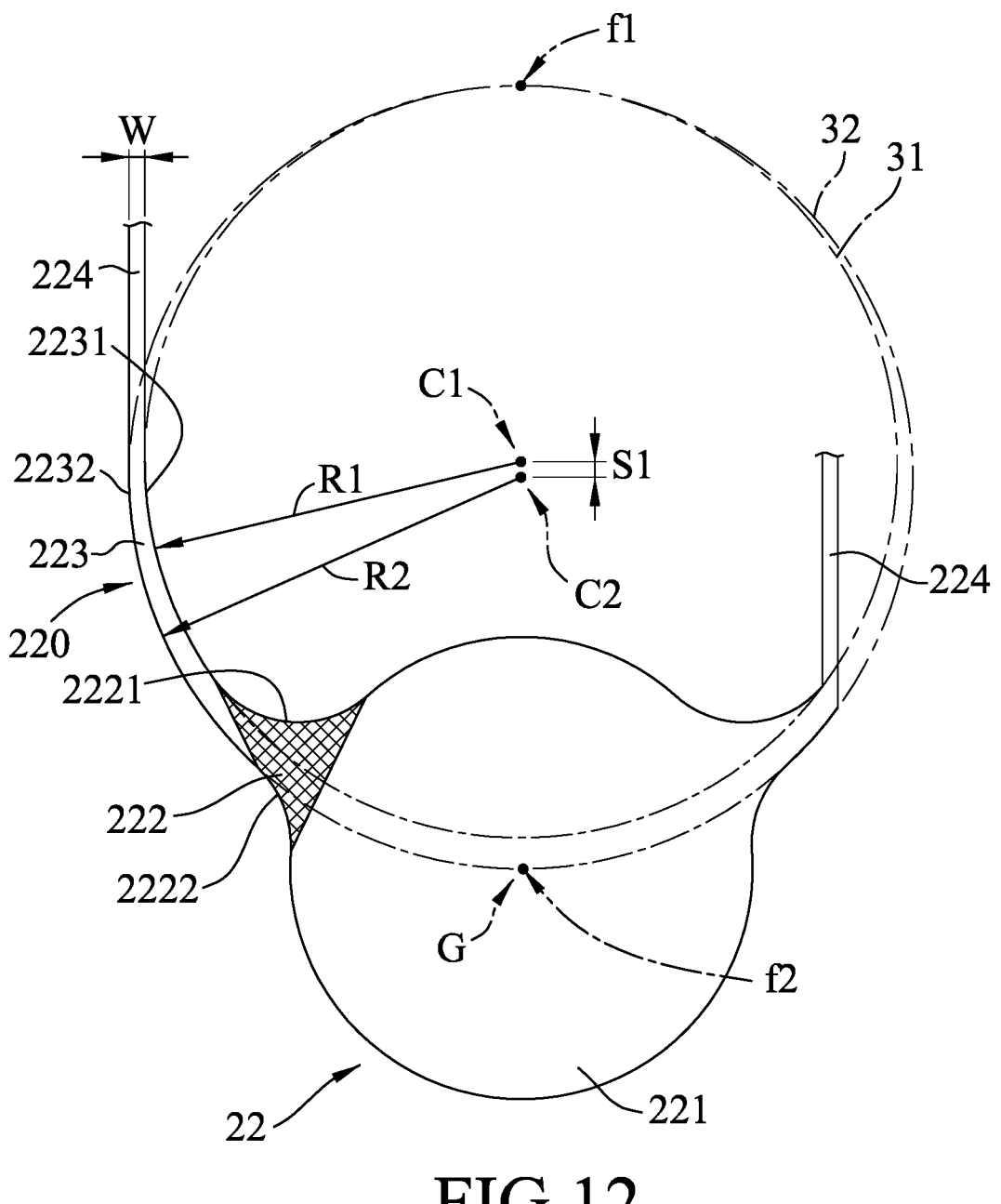
FIG. 12 is a schematic top view illustrating a second electrode of a third embodiment of the LED device accord-ing to the disclosure.

Referring to FIGS. 9 to 11, a second embodiment of the LED device 2 according to the disclosure is generally similar to the first embodiment of the LED device 1, except for the configuration of the second electrode 22. Specifically, the second embodiment of the LED device 2 has a width greater than that of the LED device 1, e.g., equal to or greater than 9 mil, and the extending portion 220 of the second electrode 22 thereof is designed to have the following configuration.

Referring to FIG. 10, in the second embodiment, the first curved side 2231 and the second curved side 2232 are parts of the first imaginary circle 31 and the second imaginary circle 32 (illustrated with dot-dashed circles), respectively. The first imaginary circle 31 is internally tangent to the second imaginary circle 32. The point of tangency between the first imaginary circle 31 and the second imaginary circle 32 is defined as the first point (f1). The point on the second imaginary circle 32 that is the farthest from the first point (f1) is defined as the second point (f2). The first straight line (L1) connecting the first point (f1) and the second point (f2) passes through the center of the second imaginary circle 32. A point on the first imaginary circle (31) that is the farthest from the first point (f1) is defined as a third point (f3). A line connecting the first point (f1) and the third point (f3) passes through the center of the first imaginary circle 31. A third straight line (L3) connects the second point (f2) and the third point (f3). A fourth straight line (L4) that passes through a center of the third straight line (L3) and that is perpendicular to the third straight line (L3) passes through the geometric center (G) of the projection of the body portion 221 on the epitaxial layered structure 12.

A fifth straight line (L5) in a horizontal direction passes through the geometric center (G) of the projection of the body portion 221. Moreover, a sixth straight line (L6) is perpendicular to the fifth straight line (L5) and passes through the geometric center (G) of the projection of the body portion 221 on the epitaxial layered structure 12. The fifth straight line (L5) coincides with the fourth straight line (L4). In this embodiment, two extending portions 220 extend from opposite sides of the body portion 221 and are arranged in a mirror symmetric manner relative to the sixth straight line (L6). In certain embodiments, each of the extending portions 220 extends from the body portion 221 along the fifth straight line (L5). In certain embodiments, the second electrode further includes a straight extending portion 230 extending from the body portion 221 along the sixth straight line (L6), and the first imaginary circle 31 and the second imaginary circle 32 are respectively tangent to two opposite sides of the straight extended portion 230 relative to the sixth straight line (L6).

In certain embodiments, the arc length of the first curved side 2231 is equal to one fourth of the circumference of the first imaginary circle 31, and the arc length of the second curved side 2232 is equal to one fourth of the circumference of the second imaginary circle 32. The distance from the first connecting point that interconnects the first curved side 2231 and the projection of the straight section 224 to the second connecting point that interconnects the second curved side 2232 and the projection of the straight section 224 is equal to the width (W) of the projection of the straight section 224. A distance from a third connecting point that interconnects the projection of the connecting section 222 on epitaxial layered structure 12 and the first curved side 2231 to a fourth connecting point that interconnects the projection of the connecting section 222 and the second curved side 2232 (i.e., a distance between the second point (f2) and the third point (f3)) is two times the width (W) of the projection of the straight section 224. In other words, the projection of the curved section 223 has a width of 2W at an end adjacent to the connecting section 222, and a width of W at an end adjacent to the straight section 224. This means that the width of the projection of the curved section 223 is equal to or greater than the width (W) of the projection of the straight section 224 and is equal to or smaller than two times the width (W) of the projection of the straight section 224.

In addition, the first connecting side 2221 and the second connecting side 2222 are curved in opposite directions. To be specific, as shown in FIG. 11, the first connecting side 2221 and the second connecting side 2222 are disposed opposite to each other and are convex toward the fifth straight line (L5). The third radius of curvature (R3) of the first connecting side 2221 is equal to the fourth radius of curvature (R4) of the second connecting side 2222, such as 10 μm or 15 μm.

In certain embodiments, the first imaginary circle 31 may not be internally tangent to the second imaginary circle 32. For example, the first imaginary center of curvature (C1) of the first curved side 2231 may coincide with the second imaginary center of curvature (C2) of the second curved side 2232. That is to say, the distance between the first imaginary center of curvature (C1) and the second imaginary center of curvature (C2) is zero. In such case, the projection of the curved section 223 may have a fixed width rather than a width that gradually decreases in the extending direction from the connecting section 222 toward the straight direction 224. With such arrangement, a surface area of the projection of the curved section 223 may be minimized so that the influence of light absorption may greatly be reduced and the brightness of the LED device 2 may be increased. The diameter of the first imaginary circle 31 may be adjusted and predetermined according to the size of the LED device 2 and the environment in which the LED device 2 is to be used.

Referring to FIG. 13, a third embodiment of the LED device according to the disclosure is generally similar to the first embodiment of the LED device 1, except for the configuration of the second electrode 22.

Specifically, in the third embodiment, the two extending portions 220 are respectively extended from left and right sides of the body portion 221, in which only one extending portion 220 on the left side of the body portion 221 includes the curved section 223. That is to say, the left-side extending portion 220 includes the connecting section 222, the curved section 223 and the straight section 224 in a direction away from the body portion 221. On the other hand, the right-side extending portion 220 only includes the connecting section 222 and the straight section 224 in the direction away from the body portion 221. With this arrangement, current crowding present in the curved section 223 of the second electrode 22 may still be reduced and the area of injection of the charge carriers may also be expanded.

The disclosure also provides a light emitting apparatus that includes the LED device 1 and/or the LED device 2 as mentioned above.

It should be noted that the distance (S1) between the first imaginary center of curvature (C1) and the second imaginary center of curvature (C2) may readily be measured by those skilled in the art using any well-known equipment, such as a scanning electron microscope (SEM) or an atomic force microscope (AFM). For example, an image of the LED device is captured by the equipment. Then, three points on each of the first curved side 2231 and the second curved side 2232 are selected to form a respective one of the first imaginary circle 31 having the first imaginary center of curvature (C1) and the second imaginary circle 32 having the second imaginary center of curvature (C2) using a software installed in the equipment, followed by measurement of the distance (S1) between the first imaginary center of curvature (C1) and the second imaginary center of curvature (C2).

Additionally, in certain embodiments, each of the first curved side 2231 and the second curved side 2232 may be formed out of a plurality of line segments having gradually varied slopes.

In summary, by optimizing the configuration of the extending portion 220 of the second electrode 22, i.e., widening the width of the curved section 223, the LED device 1, 2 of this disclosure may achieve a reduced current crowding effect and increase the area of injection of the charge carrier, thereby preventing burnout of the LED device 1, 2 during aging.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light emitting diode (LED) device, comprising:
an epitaxial layered structure that includes a first semiconductor layer, a light emitting layer and a second semiconductor layer sequentially disposed in such order;
a first electrode that is disposed on said epitaxial layered structure and that is electrically connected to said first semiconductor layer;
a second electrode that is disposed on said epitaxial layered structure, that is electrically connected to said second semiconductor layer, and that includes a body portion and at least one extending portion connected to said body portion and extending in a direction away from said body portion, said extending portion including at least one curved section,
wherein a projection of said curved section on said epitaxial layered structure includes a first curved side and a second curved side that are opposite to each other and that are curved in an identical direction, said first curved side having a first imaginary center of curvature and a first radius of curvature, said second curved side having a second imaginary center of curvature and a second radius of curvature that is larger than the first radius of curvature, and
a distance between the first imaginary center of curvature and the second imaginary center of curvature is equal to or smaller than 5 μm.

2. The LED device as claimed in claim 1, wherein the distance between the first imaginary center of curvature and the second imaginary center of curvature is equal to or greater than 1 μm.

3. The LED device as claimed in claim 1, wherein said first curved side is a part of a first imaginary circle and said second curved side is a part of a second imaginary circle, and wherein the first imaginary center of curvature and the second imaginary center of curvature coincide with centers of the first imaginary to circle and the second imaginary circle, respectively.

4. The LED device as claimed in claim 3, wherein said first curved side has an arc length equal to or smaller than one fourth of a circumference of the first imaginary circle, and said second curved side has an arc length equal to or smaller than one fourth of a circumference of the second imaginary circle.

5. The LED device as claimed in claim 3, wherein the first imaginary circle is internally tangent to the second imaginary circle.

6. The LED device as claimed in claim 5, wherein:
a point of tangency between the first imaginary circle and the second imaginary circle is defined as a first point, and a point on the second imaginary circle that is farthest from the first point is defined as a second point, and
a first straight line connects the first point and the second point, and a second straight line perpendicular to the first straight line and passing through the second point passes through a geometric center of a projection of said body portion on said epitaxial layered structure.

7. The LED device as claimed in claim 6, wherein a proportion of an arc length of said first curved side to a circumference of the first imaginary circle is smaller than a proportion of an arc length of said second curved side to a circumference of the second imaginary circle.

8. The LED device as claimed in claim 6, wherein the centers of the first imaginary circle and the second imaginary circle and the geometric center of said projection of said body portion are collinear.

9. The LED device as claimed in claim 5, wherein:
a point of tangency between the first imaginary circle and the second imaginary circle is defined as a first point, a point on the second imaginary circle that is farthest from the first point is defined as a second point, and a point on the first imaginary circle that is farthest from the first point is defined as a third point, and
a third straight line connects the second point and the third point, and a fourth straight line perpendicular to the third straight line passing through a center of the third straight line passes through a geometric center of a projection of said body portion on said epitaxial layered structure.

10. The LED device as claimed in claim 1, wherein said extending portion further includes a straight section that connects to said curved section and a connecting section that connects said body portion and said curved section.

11. The LED device as claimed in claim 10, wherein a projection of said straight section on said epitaxial layered structure has a width that is equal to or smaller than a width of said projection of said curved section on said epitaxial layered structure.

12. The LED device as claimed in claim 10, wherein a projection of said straight section on said epitaxial layered structure has a width ranging from 2 μm to 4 μm.

13. The LED device as claimed in claim 10, wherein a difference between the first radius of curvature and the second radius of curvature is equal to a width of a projection of said straight section on said epitaxial layered structure.

14. The LED device as claimed in claim 10, wherein a projection of said connecting section on said epitaxial layered structure has a width that is equal to or greater than a width of said projection of said curved section on said epitaxial layered structure, and includes:
a first connecting side that is connected to said first curved side and that has a third radius of curvature, and
a second connecting side that is connected to said second curved side and that has a fourth radius of curvature; and
said first connecting side and said second connecting side are curved in opposite directions, and
the third radius of curvature and the fourth radius of curvature are smaller than the first radius of curvature.

15. The LED device as claimed in claim 10, wherein a distance from a first connecting point that interconnects a projection of said straight section on said epitaxial layered structure and said first curved side to a second connecting point that interconnects said projection of said straight section and said second curved side is a minimum width of said projection of said curved section on said epitaxial layered structure.

16. The LED device as claimed in claim 10, wherein a distance from a third connecting point that interconnects a projection of said connecting section on said epitaxial layered structure and said first curved side to a fourth connecting point that interconnects said projection of said connecting section and said second curved side is two times a width of said projection of said straight section on said epitaxial layered structure.

17. The LED device as claimed in claim 10, wherein a projection of said curved section on said epitaxial layered structure has a width that gradually decreases in an extending direction from said connecting section toward said straight direction.

18. The LED device as claimed in claim 10, wherein a projection of said curved section on said epitaxial layered structure as a width that is equal to or greater than a width of a projection of said straight section on said epitaxial layered structure and that is equal to or smaller than two times a width of said projection of said straight section on said epitaxial layered structure.

19. The LED device as claimed in claim 1, wherein the first imaginary center of curvature of said first curved side coincides with the second imaginary center of curvature of said second curved side.

20. A light emitting apparatus comprising the LED device of claim 1.

*   *   *   *   *